(12) United States Patent
Hölzle

(10) Patent No.: US 6,639,435 B2
(45) Date of Patent: Oct. 28, 2003

(54) ADJUSTABLE FREQUENCY DIVIDER

(75) Inventor: Josef Hölzle, Bad Wörishofen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/200,635

(22) Filed: Jul. 22, 2002

(65) Prior Publication Data

US 2003/0007591 A1 Jan. 9, 2003

Related U.S. Application Data

(63) Continuation of application No. PCT/DE01/00191, filed on Jan. 17, 2001.

(30) Foreign Application Priority Data

Jan. 20, 2000 (DE) .......................................... 100 02 361

(51) Int. Cl.[7] ............................................ H03K 25/00
(52) U.S. Cl. ........................................ 327/115; 327/116
(58) Field of Search ................................ 327/115, 116, 327/117, 355; 377/47, 48

(56) References Cited

U.S. PATENT DOCUMENTS

| | | | |
|---|---|---|---|
| 3,824,378 A | 7/1974 | Johnson et al. | 235/92 PE |
| 4,415,861 A | 11/1983 | Palmquist et al. | 328/58 |
| 5,065,415 A | 11/1991 | Yamashita | 377/52 |
| 5,404,564 A | 4/1995 | Hiwada et al. | 395/800 |
| 6,114,915 A * | 9/2000 | Huang et al. | 331/25 |
| 6,329,850 B1 * | 12/2001 | Mair et al. | 327/107 |

FOREIGN PATENT DOCUMENTS

| | | |
|---|---|---|
| DE | 38 36 822 C2 | 5/1990 |
| DE | 40 08 385 C2 | 4/1991 |
| EP | 0 406 366 B1 | 1/1991 |

* cited by examiner

*Primary Examiner*—Timothy P. Callahan
*Assistant Examiner*—An T. Luu
(74) *Attorney, Agent, or Firm*—Laurence A. Greenberg; Werner H. Stemer; Gregory L. Mayback

(57) ABSTRACT

The novel frequency divider has an adjustable divider ratio. Such circuits are subject to demands for ever higher clock frequencies. The circuit generates the output signal in a blockwise manner and converts it into a sequential signal in a parallel-serial converter on the output side and outputs it in a bitwise manner. As a result, the essential part of the frequency divider circuit can be operated with a slower frequency than the input frequency, which in turn enables higher input frequencies.

7 Claims, 4 Drawing Sheets

ADJUSTABLE FREQUENCY DIVIDER

CROSS-REFERENCE TO RELATED APPLICATION

This application is a continuation of copending International Application No. PCT/DE01/00191, filed Jan. 17, 2001, which designated the United States and which was not published in English.

BACKGROUND OF THE INVENTION

FIELD OF THE INVENTION

The present invention relates to a digital frequency divider circuit.

Frequency divider circuits are among the basic circuits of digital technology. Frequency dividers are digital circuits wherein the input frequencies are integer multiples of the output frequencies. Such circuits are used for example in radiofrequency technology, where there exists continual demand for the development of circuits with ever higher clock rates or frequencies. In order to realize frequency divider circuits, usually a plurality of gates are connected in series in a combinatorial part of the circuit, so that, for each state change of the input signal, many gates are switched within one clock period.

Such a frequency divider is described for example in U.S. Pat. No. 5,065,415 and German patent DE 40 08 385 C2. In order to generate an output signal, a plurality of prescalers are cascaded, of which each prescaler can be changed over between the operating modes divide-by-2 and divide-by-3. Each prescaler is connected to a device which enables the state of the respective prescaler to be set in such a way that, within a division cycle of the frequency divider: the individual prescalers divide by 2 or by 3 in a first time period within the division cycle and divide by 2 in the subsequent time period within the same division cycle.

The maximum possible input frequency of a frequency divider is thus limited by the sum of the signal propagation times of the series-connected gates.

In the past, essentially two solution approaches have emerged for combating this problem. Firstly, attempts are made to further develop the semiconductor technology used such that the signal propagation times become ever shorter. Another procedure consists in reducing as far as possible the number of gates to be traversed. This is possible for example by using a PN (pseudo noise) code.

However, even the use of fast semiconductor technology or the use of PN codes often no longer satisfies the requirements for ever higher-frequency circuits. In particular the demands for frequency divider circuits with an arbitrarily adjustable divider ratio and demands for an adjustable duty ratio (duty cycle) of the output signal cause the known methods to encounter frequency limits.

SUMMARY OF THE INVENTION

It is accordingly an object of the invention to provide a frequency divider, which overcomes the above-mentioned disadvantages of the heretofore-known devices and methods of this general type and which provides for a frequency divider with an adjustable divider ratio that can process higher clock rates.

With the foregoing and other objects in view there is provided, in accordance with the invention, a frequency divider, comprising:

an input terminal for receiving an input signal with a first clock frequency and an output terminal for an output signal;

a state register, encompassing n bits, for storing a register state from a multiplicity of register states;

a decoder connected to the state register, the decoder assigning to the register states in each case an m-bit word, a plurality of second n-bit words, and state-dependent variables;

a loading device connected to the state register and configured to write, depending on an adjustable divider ratio and the state-dependent variables, one of the n-bit words to the state register at a second clock frequency corresponding to the frequency of the input signal divided by m; and a parallel-serial converter connected to the loading device for reading in the m-bit words in parallel at the second clock frequency and outputting the m-bit words serially as the output signal.

In accordance with a further feature of the invention, there is provided, for the special case divider ratios of TV=2 and TV=3, respective additional circuitry for bypassing the register and the decoder, connected to an internal bus connected between an input and the output of the multiplexer.

In other words, the objects of the invention are achieved with a frequency divider that comprises: a terminal for an input signal with a first clock frequency and a terminal for an output signal, a state register, comprising n bits (n is an integer), for storing a register state from a multiplicity of register states, a decoder, which is connected to the state register, and which assigns to the register states in each case an m-bit word, a plurality of second n-bit words and state-dependent variables, a loading device, which, depending on an adjustable divider ratio and the state-dependent variables, writes one of the n-bit words to the state register with a second clock frequency, which corresponds to that of the input signal divided by m and a parallel-serial converter, which reads in the m-bit words in parallel in the second clock frequency and outputs them serially as output signal.

The invention is based on the principle that the output signal of a frequency divider is not generated and output in a bitwise manner, rather the output signal is decomposed into blocks each of m bits. Consequently, a time which is m times as long as the clock time of the input signal is available for forming each such m-bit word. Consequently, higher clock rates can be processed. The m-bit words are joined together at an output of the circuit and output serially.

The frequency divider according to the invention has a state register having a multiplicity of counter states. In each case an m-bit word is combined with the states of the state register which word is read in in a parallel-serial converter and is output serially. The state register is consequently operated with a clock which is m times as slow as the input clock. Consequently, for the formation of the m-bit words, and for the formation of further variables respectively dependent on the counter state, the m-fold time is available, relative to a conventional frequency divider circuit wherein in each case a multiplicity of gates must be traversed per input clock period in the combinatorial part of the circuit. The assignment of the state-dependent variables and of further n-bit words is effected in a decoder. The n-bit state register is loaded anew with a subsequent state by the loading device in each case after a slow clock period has elapsed. For this, the loading device requires the n-bit words generated in the decoder, the loading of the state register being dependent, of course, on the divider ratio set. This is because the loading of the state register with a new n-bit word can be equated to jumping to a new state, after which in each case new, dependent one- and multi-bit variables are again generated.

The counter states of the n-bit state register can be coded with a selectable code. Of course, the state-dependent further n-bit words which define the respective succeeding state must then likewise be defined in accordance with the code used in the state register.

The present circuit advantageously has an adjustable duty ratio. At the same time, however, the present frequency divider circuit manages with a limited number of register states since, although the order of the register states that are respectively loaded one after the other depends on the divider ratio set, the divider nonetheless has recourse, in principle, independently of the duty ratio set, to the same set of register states, only in a different order.

Since most of the circuit according to the invention is operated with a comparatively slow clock, that is to say a clock with a frequency m times slower than the input frequency, the circuit design is simplified to a significant extent with regard to drivers and line lengths. The present frequency divider continues to operate correctly even when the divider ratio is changed over to a different value at an arbitrary point in time while the frequency divider is operating.

In accordance with an added feature of the invention, the parallel-serial converter is realized as a multiplexer. Multiplexer circuits are known to be extremely reliable.

In accordance with an additional feature of the invention, the bit width of the counter states is equal to the bit width of the m-bit words, and consequently the relationship m=n holds true. By way of example, the use of 4-bit blocks is advantageous for achieving significantly higher clock frequencies, with the result that the decoder circuit can be operated with a quarter of the input clock frequency. Consequently, quadruple the time is available for the formation of the 4-bit blocks. Given the same bit width of the state register, $_2{}^n=2^4=16$ follows for the number of register states of the state register.

In accordance with another feature of the invention, the duty ratio (duty cycle) of the output signal of the frequency divider can be set in a simple manner by defining the coding of the m-bit words of the register in accordance with the desired duty ratio.

Other features which are considered as characteristic for the invention are set forth in the appended claims.

Although the invention is illustrated and described herein as embodied in a frequency divider, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
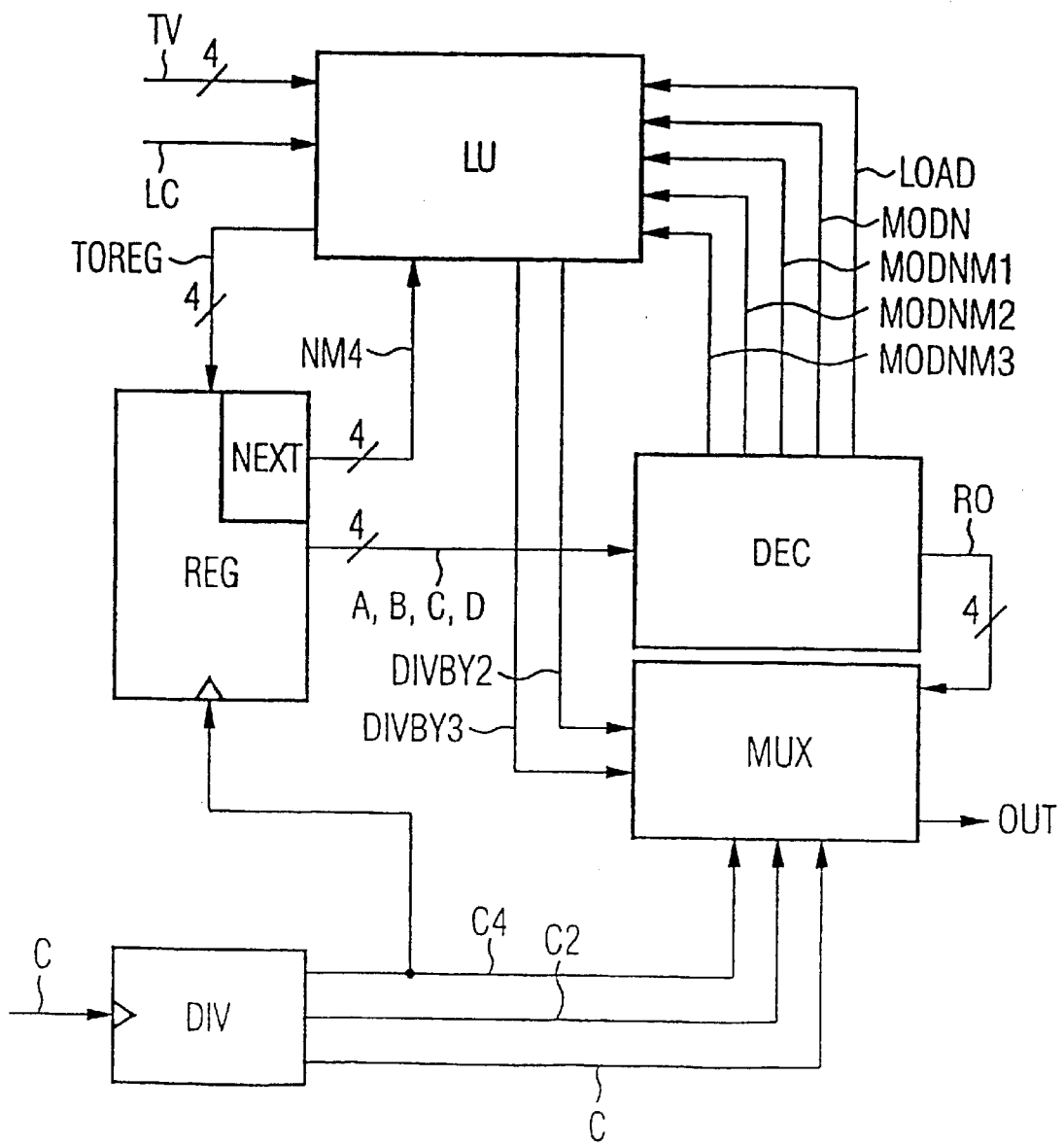
FIG. 1 is a block diagram of a frequency divider according to the invention.

Referring now to the figures of the drawing in detail and first, particularly, to FIG. 1 thereof, there is shown an embodiment of the present invention using a block diagram which can be divided into a plurality of interconnected blocks. The blocks include a state register REG, which has a multiplicity of register states D, C, B, A, a decoder DEC, a multiplexer MUX, a loading device or loading unit LU, and additionally an auxiliary divider DIV. The circuit configuration of a frequency divider according to the invention as shown in FIG. 1 has a signal input C and also a signal output OUT. A bus input for setting a divider ratio TV, and a clock signal LC, with which a new divider ratio TV can be written to the loading unit LU, can be fed to the loading unit LU.

Both the state register REG and the blocks RO which can be fed to the multiplexer MUX have a width of 4 bits in each case in the exemplary embodiment.

The auxiliary divider DIV provides a clock signal C4, which has a frequency 4 times lower than the input clock signal C. Both the register REG and, in dependence thereon, the decoder DEC and also the loading unit LU are operated with this slow frequency C4. Apart from the output-side part of the multiplexer MUX and the input of the auxiliary divider DIV, the entire circuit configuration according to the invention is clocked with the slower clock signal C4. On the one hand, 4-bit blocks RO and on the other hand a plurality of state-dependent variables LOAD, MODN, MODNM1, MODNM2 and MODNM3 are formed in the decoder DEC, in a manner dependent on the register state bits A, B, C, D, by logic combinations thereof. The 4-bit words RO are placed one after the other in the multiplexer MUX and output in a bitwise manner at the output OUT. The loading device LU supplies the state register REG with a subsequent state via the bus TOREG. Said subsequent state depends, of course, on the divider ratio TV set, but also on the state-dependent variables LOAD, MODN, MODNM1, MODNM2 and MODNM3 provided in the decoder. Via the bus NM4, the register REG has the possibility of itself passing its subsequent state to the loading device LU, which can write said state to the state register REG via the bus TOREG again under specific preconditions.

Figure 2:
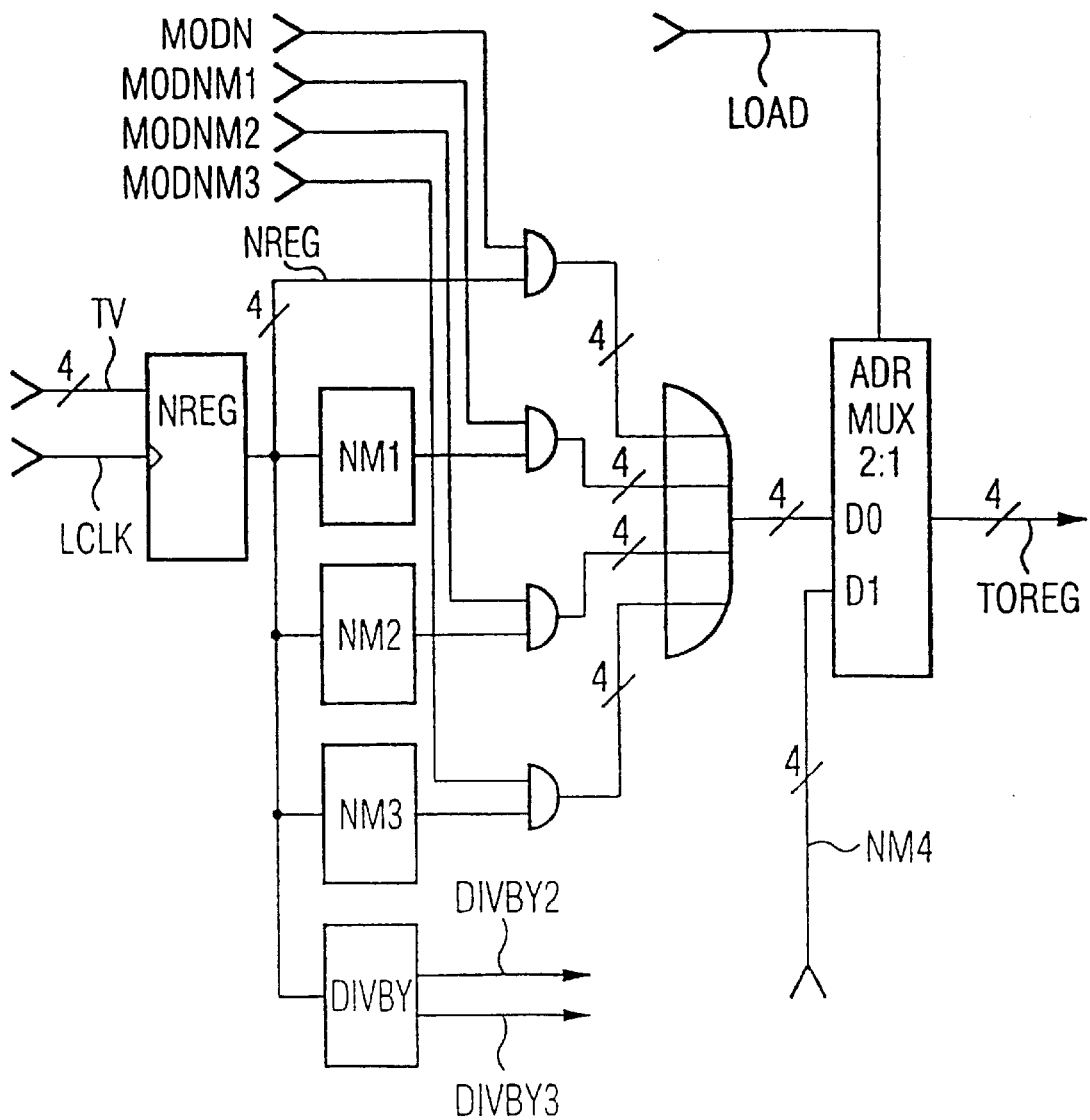
FIG. 2 is a schematic diagram of an exemplary embodiment of the charging device block of FIG. 1.

FIG. 2 shows a diagrammatic embodiment possibility for the block loading unit LU of FIG. 1. The bus NM4 is passed on to the bus TOREG only when the loading variable LOAD switches the input D1 of the 2:1 multiplexer ADRMUX through to the output. In all other cases, that is to say when LOAD=0, a 4-bit word dependent on the divider ratio TV, and also on the 4-bit words NM3, NM2 or NM1, or the divider ratio TV itself is passed to the register REG as subsequent state for the register REG. The divider ratio TV is stored in the register NREG in this case. Each of these last-mentioned 4-bit words is in each case combined with a variable MODN, MODNM1, MODNM2 and MODNM3, assigned to it, via an AND gate. The outputs of the AND gates in turn are connected via an OR module having 4 inputs to the input D0 of the multiplexer ADRMUX.

Figure 3:
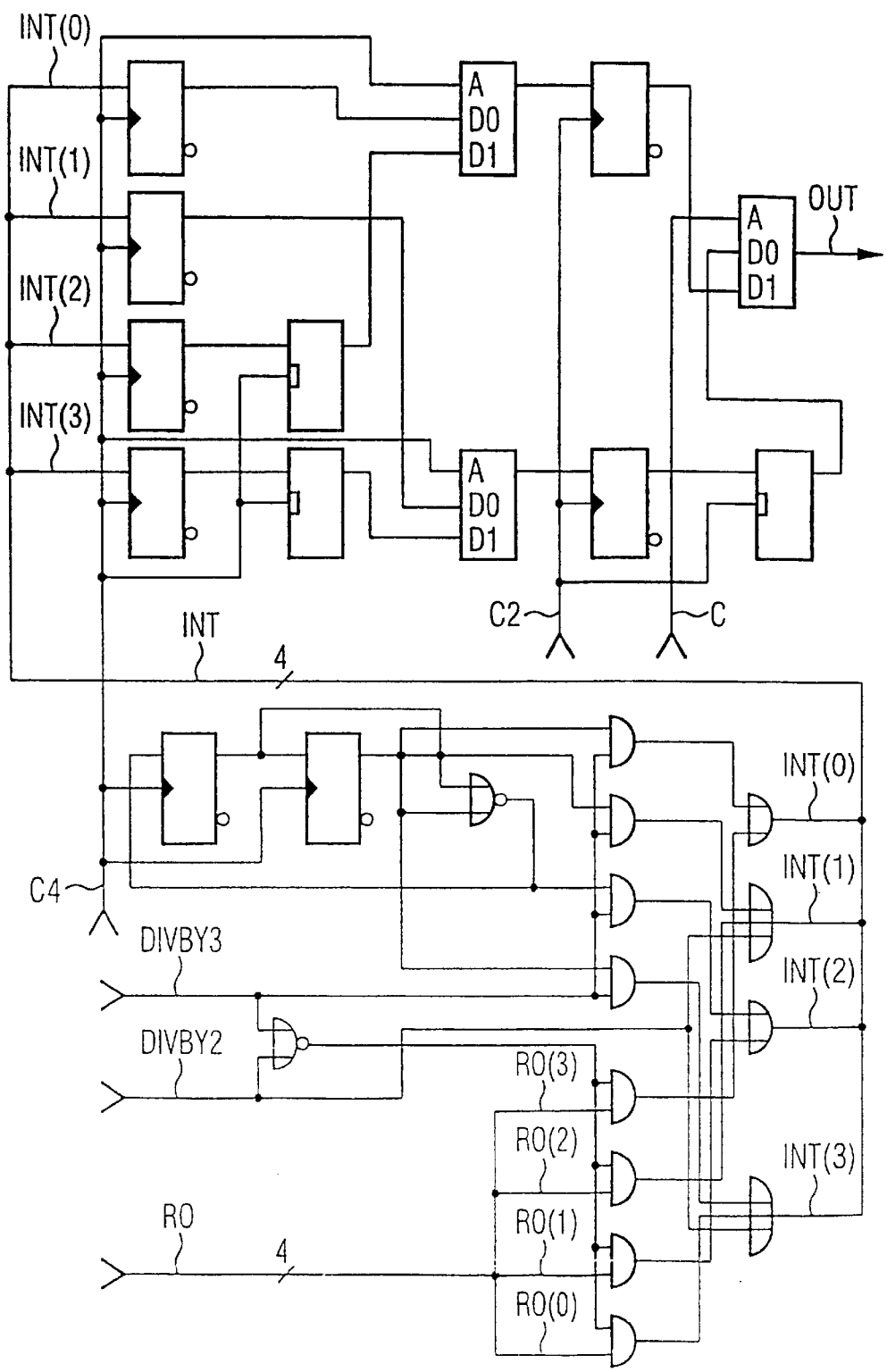
FIG. 3 is a schematic diagram of an exemplary embodiment of the multiplexer block of FIG. 1.

The multiplexer MUX from FIG. 1 is explained using a diagrammatic example in FIG. 3. As main input, the multiplexer has the bus RO, which has a width of 4 bits. The multiplexer MUX is accorded the task of outputting these four bits of the bus input RO serially and in a bitwise manner one after the other at the output OUT. For this purpose, the input clock signal C of the frequency divider according to the invention is applied, of course, to the output module of the multiplexer. In addition, the circuit of the multiplexer also requires the slow clock C4, and the intermediate clock C2. C2 has half the frequency of C, and C4 half the frequency of C2. Since the present 4-bit frequency divider is intended to enable arbitrary divider ratios of two to sixteen, and the blocks at the output of the decoder DEC have a width of four bits, for the special cases "by two" and "by three", provision is made of an auxiliary circuit, and also an additional internal bus INT in the multiplexer. For the case where the divider ratio TV is equal to 2, the variable DIVBY2 is set to the value 1, and for the case where the divider ratio TV is equal to 3, the variable DIVBY3 is correspondingly set to the value 1. In the special case of divider ratio TV equal to 2, the output signal OUT at the multiplexer must continually output the bit sequence 010101 . . . For this purpose, INT(1) and INT(3) are set to the value present and at whose outputs the clock signal C2, which has half the frequency of C, and the clock signal C4, which has half the clock frequency of C2, are present. This realization of the block DIV from FIG. 1 provides the slower clock signals required for the rest of the circuit.

In order to elucidate the drawing illustrated in FIGS. 1 to 6, by way of example the division operation "by ten" will now be explained in more detail. For this purpose, a table is specified which describes all $2^4=16$ register states of the state register REG and contains the state-dependent variables LOAD, MODN, MODNM1, MODNM2, MODNM3 assigned to the register bits D, C, B, A by means of the logic combinations described, and also the 4-bit word RO and the subsequent states NM1, NM2, NM3 and NM4.

The following abbreviations are applicable in the following state table:

|     | D | C | B | A | (1) | (2) | (3) | (4) | (5) | RO   | NM1  | NM2  | NM3  | NM4  |
| --- | - | - | - | - | --- | --- | --- | --- | --- | ---- | ---- | ---- | ---- | ---- |
| :16 | 0 | 0 | 0 | 0 | 1   | 0   | 0   | 0   | 0   | 0000 | 0001 | 0010 | 0011 | 0100 |
| :15 | 0 | 0 | 0 | 1 | 1   | 0   | 0   | 0   | 0   | 0000 | 0010 | 0011 | 0100 | 0101 |
| :14 | 0 | 0 | 1 | 0 | 1   | 0   | 0   | 0   | 0   | 0000 | 0011 | 0100 | 0101 | 0110 |
| :13 | 0 | 0 | 1 | 1 | 1   | 0   | 0   | 0   | 0   | 0000 | 0100 | 0101 | 0110 | 0111 |
| :12 | 0 | 1 | 0 | 0 | 1   | 0   | 0   | 0   | 0   | 0000 | 0101 | 0110 | 0111 | 1000 |
| :11 | 0 | 1 | 0 | 1 | 1   | 0   | 0   | 0   | 0   | 0000 | 0110 | 0111 | 1000 | 1001 |
| :10 | 0 | 1 | 1 | 0 | 1   | 0   | 0   | 0   | 0   | 0000 | 0111 | 1000 | 1001 | 1010 |
| :9  | 0 | 1 | 1 | 1 | 1   | 0   | 0   | 0   | 0   | 0000 | 1000 | 1001 | 1010 | 1011 |
| :8  | 1 | 0 | 0 | 0 | 1   | 0   | 0   | 0   | 0   | 0000 | 1001 | 1010 | 1011 | 1100 |
| :7  | 1 | 0 | 0 | 1 | 1   | 0   | 0   | 0   | 0   | 0000 | 1010 | 1011 | 1100 | 1101 |
| :6  | 1 | 0 | 1 | 0 | 1   | 0   | 0   | 0   | 0   | 0000 | 1011 | 1100 | 1101 | 1110 |
| :5  | 1 | 0 | 1 | 1 | 1   | 0   | 0   | 0   | 0   | 0000 | 1100 | 1101 | 1110 | 1111 |
| :4  | 1 | 1 | 0 | 0 | 0   | 1   | 0   | 0   | 0   | 0001 | 1101 | 1110 | 1111 | 0000 |
| :3  | 1 | 1 | 0 | 1 | 0   | 0   | 1   | 0   | 0   | 0010 | 1110 | 1111 | 0000 | 0001 |
| :2  | 1 | 1 | 1 | 0 | 0   | 0   | 0   | 1   | 0   | 0100 | 1111 | 0000 | 0001 | 0010 |
|     | 1 | 1 | 1 | 1 | 0   | 0   | 0   | 0   | 1   | 1000 | 0000 | 0001 | 0010 | 0011 |

(1): LOAD
(2): MODN
(3): MODNM1
(4): MODNM2
(5): MODNM3

1 via OR modules. In the case where the divider ratio TV is equal to 3, that is to say that a bit sequence 001001 . . . is to be output at the output OUT, an additional circuitry is provided for generating this bit sequence, and is likewise connected to the internal bus INT of the multiplexer MUX.

Figure 4:
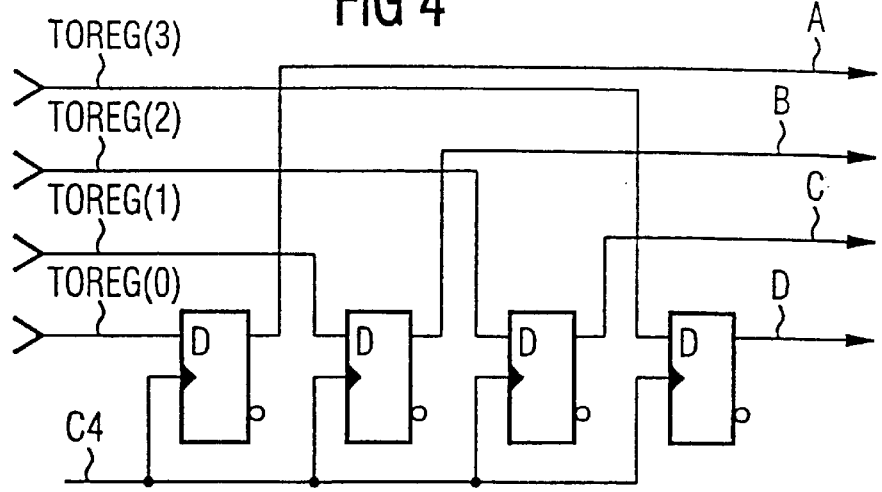
FIG. 4 is a schematic diagram of an exemplary embodiment of the register block of FIG. 1.

Such circuits for frequency dividers with divider ratios TV=2 or TV=3 are not directly part of the present invention, but rather merely advantageously supplement it by those divider ratios TV which are less than the bit width m of the output block RO, for which TV<m thus holds true. In applications of a frequency divider wherein the occurrence of divider ratios TV<m is precluded, these additional circuits and also the internal bus of the multiplexer can be omitted. FIG. 4 describes the register REG, with the 4-bit input bus TOREG and the output bus A, B, C, D. It can readily be seen that the state register REG is clocked with the clock signal C4, that is to say the slow clock.

Figure 5:
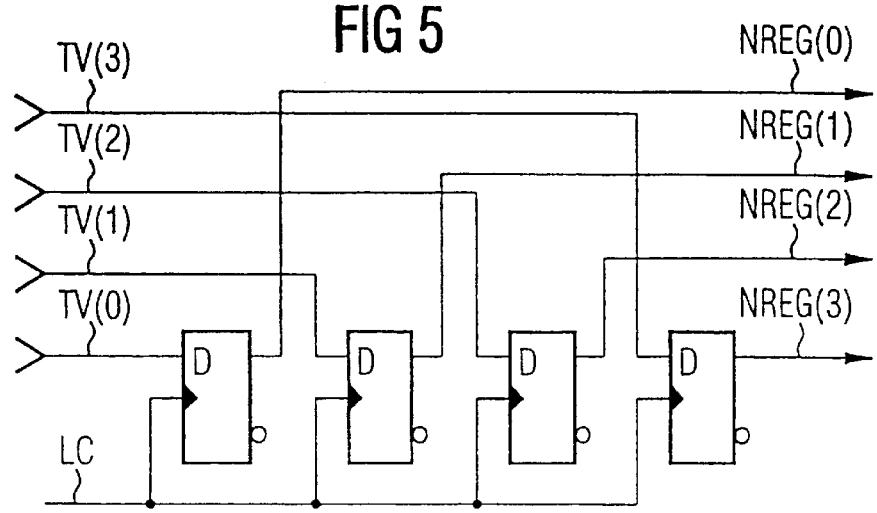
FIG. 5 is a schematic diagram of an exemplary embodiment of the NREG block of FIG. 2.

The situation is similar with the circuit configuration illustrated in FIG. 5, which describes the block NREG of FIG. 2 in more detail using an exemplary embodiment. The input bus divider ratio TV, which has a width of 4 bits, is forwarded to an output of the register NREG. The circuit is clocked with the loading clock signal LC.

Figure 6:
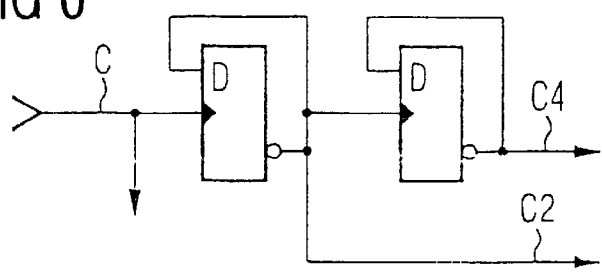
FIG. 6 is a schematic diagram of an exemplary embodiment of the DIV block of FIG. 1.

Finally, FIG. 6 shows a simple by-2 and by-4 frequency divider circuit, at whose input the input clock signal C is The table presented above will now be explained by way of example with reference to the division operation "by ten". Since TV=10 holds true, firstly the state D, C, B, A=0110 is loaded into the register REG, which corresponds to the row TV:10 in the table. Since the variable LOAD=1, NM4=1010 is written as subsequent state to the register REG. At the same time, RO=0000 is fed to the multiplexer at the output.

The subsequent state 1010 corresponds to the row :6 of the table, DCBA=1010 holding true. Since LOAD=1 in this case as well, the subsequent state 1110 is passed on. At the same time, RO=0000 is written to the output. The new state is now DCBA=1110, which corresponds to the row :2 in the table. In this case, MODNM2=1 now holds true, and it follows from this that the subsequent state is formed from divider ratio minus two: TV−2=10−2=8. The subsequent state is thus the row :8 where DCBA=1000. At the same time RO=0100 is passed to the output. LOAD=1 and RO=0000 hold true in the row :8. The subsequent state is 1100. This subsequent state corresponds to the row :4 of the table where DCBA=1100 and RO=0001. MODN=1 furthermore holds true in this row. Together with the set divider ratio TV=10 being taken into account, precisely this divider ratio is taken over as the new state. This means that a jump has now been made to the row :10 again in the table, the sequence described having begun with this row. Thus, in the case of a divider ratio: 10, in the case of an output word width of 4 bits, the original conditions are established again after 5 slow clock cycles have been run through. The output sequence, formed by stringing together the 5 output words RO which each have a width of 4 bits, consequently reads 0000 0000 0100 0000 0001 which corresponds to a correct signal with divider ratio TV=10.

The above-described circuit configuration of a frequency divider functions analogously to the sequence described by way of example for the divider ratio TV=10 also for other divider ratios between 2 and 16 inclusive.

For even higher frequencies, it is also conceivable to take the parallelization of the output signal still further, for example by increasing the bit width of the output word RO, for example from 4 to 8 bits. The number of register states of 16 with a width of 4 bits is also not restricted to these 4 bits, but can be altered.

The register states can also be coded in any other code desired, deviating from the binary code shown in the exemplary embodiment. In this case, however, it must be ensured that the words NM1, NM2, NM3 and NM4 are likewise formed in accordance with this other code.

The duty cycle (duty ratio) of the output sequence can easily be altered by means of the invention described. Replacing the last five rows of the column RO of the table above by

_RO
0001
0011
0110
1100
1000 enables, for example, a modification of the duty cycle from 4:5 to 3:5.

The 4-bit words NM1, NM2 and NM3 depend on the four register state bits in accordance with the following logic specifications. In this case, the times dot "·" represents logic AND, the plus "+" represents logic OR, the "x" represents the EXCLUSIVE-OR function XOR and "/" represents inversion; (3) designates the left bit, (0) the right bit:

NM1 (3)=A·B·CxD
NM1 (2)=A·BxC
NM1 (1)=AxB
NM1 (0)=/A
NM2 (3)=B·CxD
NM2 (2)=BxC
NM2 (1)=/B
NM2 (0)=A
NM3 (3)=(A+B)·CxD
NM3 (2)=(A+B)xC
NM3 (1)=AxB
NM3 (0)=/A
NM4 (3)=CxD
NM4 (2)=/C
NM4 (1)=B
NM4 (0)=A

The frequency divider described in the exemplary embodiment makes it possible to realize input frequencies of 4 GHz compared with the 2.7 GHz possible hitherto.

I claim:

1. A frequency divider, comprising:
   an input terminal for receiving an input signal with a first clock frequency and an output terminal for an output signal;
   a state register, encompassing n bits, for storing a register state from a multiplicity of register states;
   a decoder connected to said state register, said decoder assigning to the register states in each case an m-bit word, a plurality of second n-bit words, and state-dependent variables;
   a loading device connected to said state register and configured to write, depending on an adjustable divider ratio and the state-dependent variables, one of the n-bit words to said state register at a second clock frequency corresponding to the frequency of the input signal divided by m; and
   a parallel-serial converter connected to said loading device for reading in the m-bit words in parallel at the second clock frequency and outputting the m-bit words serially as the output signal.

2. The frequency divider according to claim 1, wherein said parallel-serial converter is a multiplexer.

3. The frequency divider according to claim 1, wherein the following holds true for the variables m and n: m=n=4.

4. The frequency divider according to claim 3, which comprises two cascaded frequency dividers for generating the second clock frequency.

5. The frequency divider according to claim 3, which further comprises, for a special case divider ratio of 2 and a special case divider ratio of 3, respective additional circuitry for bypassing said register and said decoder, connected to an internal bus connected between an input and said output of said multiplexer.

6. The frequency divider according to claim 1, wherein a duty cycle of the output signal is adjustable by coding of the m-bit words.

7. The frequency divider according to claim 1, wherein the state-dependent variables and the further n-bit words are formable by logic combinations of the n-bit state registers.

* * * * *